(12) United States Patent
Ali et al.

(10) Patent No.: US 6,894,540 B1
(45) Date of Patent: May 17, 2005

(54) GLITCH REMOVAL CIRCUIT

(75) Inventors: Shahid Ali, New Delhi (IN); Shivraj G. Dharne, Uttarpradesh (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/738,433

(22) Filed: Dec. 17, 2003

(51) Int. Cl.$^7$ ................................................ H03K 5/00
(52) U.S. Cl. ........................................ 327/34; 327/551
(58) Field of Search .............................. 327/31, 34, 35, 327/551

(56) References Cited

U.S. PATENT DOCUMENTS

| | | | |
|---|---|---|---|
| 4,760,279 A | * | 7/1988 | Saito et al. ................... 327/34 |
| 5,019,724 A | * | 5/1991 | McClure ....................... 326/29 |
| 5,198,710 A | | 3/1993 | Houston |
| 5,479,132 A | | 12/1995 | Verhaeghe et al. |
| 5,563,532 A | | 10/1996 | Wu et al. |
| 5,748,034 A | | 5/1998 | Ketineni et al. |
| 5,760,612 A | | 6/1998 | Ramirez |
| 6,201,431 B1 | * | 3/2001 | Allen et al. ................... 327/379 |
| 6,249,141 B1 | | 6/2001 | Aspacio et al. |
| 6,356,101 B1 | | 3/2002 | Erstad |
| 6,392,474 B1 | | 5/2002 | Li et al. |
| 6,492,857 B2 | * | 12/2002 | Shuler, Jr. .................... 327/225 |
| 6,693,459 B2 | * | 2/2004 | Nedovic et al. ............... 326/93 |
| 2003/0137343 A1 | | 7/2003 | Berka et al. |
| 2003/0146778 A1 | | 8/2003 | McMahan et al. |

* cited by examiner

Primary Examiner—Dinh T. Le
(74) Attorney, Agent, or Firm—Charles E. Bergere

(57) ABSTRACT

A glitch removal circuit that removes both positive and negative glitches from an input signal includes a delay circuit, a glitch blocking circuit, and a latch circuit. The delay circuit receives the input signal and introduces a delay into it. The glitch blocking circuit is coupled to the delay circuit, and includes two NMOS transistors and two PMOS transistors. The glitch blocking circuit receives the input signal and the delayed input signal and blocks the input signal if there is a glitch in it. The latch circuit is coupled to the output of the glitch blocking circuit. The latch circuit inverts the output of the glitch blocking circuit and stores the output on a continuous basis. The latch circuit provides glitch free signal as the output.

19 Claims, 4 Drawing Sheets

GLITCH REMOVAL CIRCUIT

BACKGROUND OF THE INVENTION

The present invention relates to a circuit for removing unwanted glitches from signals and more particularly, to a glitch removal circuit that removes both positive and negative glitches from signals.

Electrical circuits often have to operate in noisy environments. Noise may be introduced into signals from a number of different sources such as cross talk between signal lines, transients caused by logic gates, electromagnetic interactions between various circuits, etc. Such noise generates spurious components in the input or output signals of the circuit. These spurious components are referred to as glitches.

Glitches distort the size and shape of the signal pulse. A glitch may cause a high signal to become low or a low signal to become high. A positive glitch may occur on a logic low signal causing it to overshoot for a brief period. Similarly, a negative glitch may occur on a logic high signal causing it to undershoot for a brief period.

Glitches, if untreated, may affect the operation of a circuit and hamper the performance of the entire system of which the circuit is a part. In digital systems, glitches may tamper with clock signals and handshake signals that drive various circuits within the system. For example, in a memory array if a glitch occurs in an address signal while it is being latched, then the wrong address may be read, which may lead to an unrecoverable system error. Also, glitches may cause chips to receive or transmit noisy signals to other chips. Thus, circuits must be designed to anticipate and handle spurious pulses or glitches in order to maintain the consistency and reliability of electrical circuit operation. A glitch removal circuit tries to remove glitches and restore an input signal to its original shape.

Existing glitch removal circuits suffer from a number of drawbacks, such as being overly complex, requiring a large number of components, and requiring a large amount of space. Hence, these circuits are difficult to implement, use valuable chip real estate, and draw excess current. Further, such circuits may also introduce an excessively long delay in the output signal as compared with the duration of the glitch to be filtered, leading to slow signal processing speeds. This may also affect the synchronization of output signals with other circuits. A glitch removal circuit should also be able to remove both positive and negative glitches simultaneously, and pulses of short duration, yet without distorting the input signal pulse width.

Accordingly, there is a need for a glitch removal circuit that can remove both positive and negative glitches, has a low delay time, and a small circuit area. Further, the circuit should be able to remove very short duration glitches.

BRIEF DESCRIPTION OF THE DRAWINGS

The following detailed description of preferred embodiments of the invention will be better understood when read in conjunction with the appended drawings. The present invention is illustrated by way of example and not limited by the accompanying figures, in which like references indicate similar elements.

DETAILED DESCRIPTION OF THE INVENTION

Figure 1:
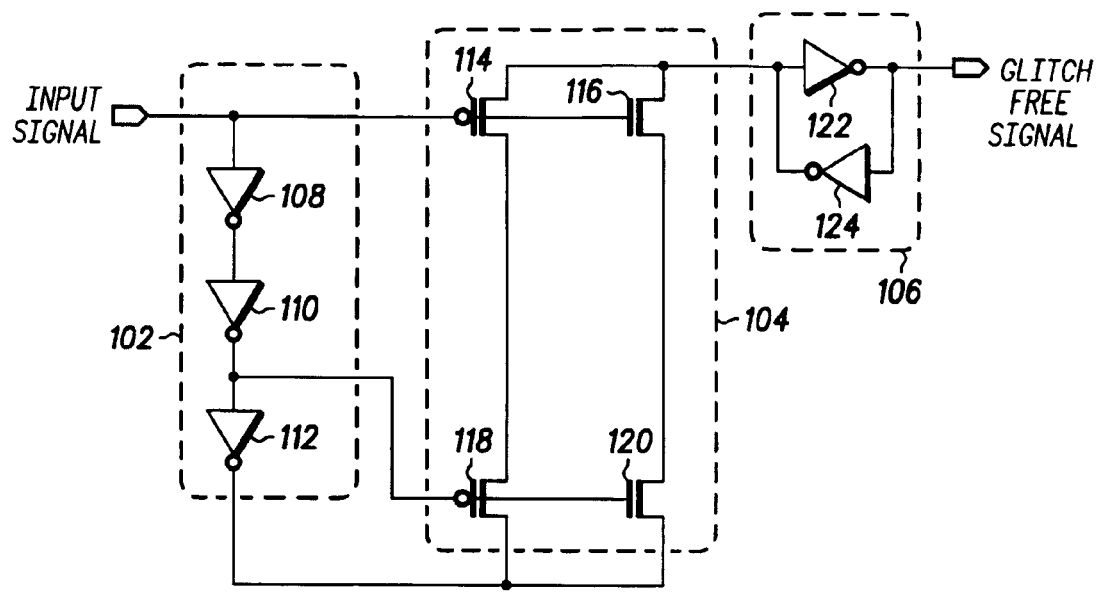
FIG. 1 is a schematic circuit diagram of a glitch removal circuit in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the spirit and scope of the invention.

For convenience, terms that have been used in the description of various embodiments are defined below. These definitions are provided merely to aid the understanding of the description, and are not to be construed as limiting the scope of the invention.

GRW—GRW is an acronym for Glitch Removal Width, which is the width of the maximum width glitch that can be removed from the input signal by a glitch removal circuit. It is desirable to have a high GRW for a glitch removal circuit.

PRI—PRI is an acronym for Performance Ratio Index, which is defined as the ratio of GRW and circuit delay. The performance of a glitch removal circuit is often measured in terms of PRI. It is desired to have a high PRI for a glitch removal circuit.

GDEL—GDEL is the minimum time delay after which a next glitch in an input signal can be removed by a glitch removal circuit. If the time interval between two glitches is less than GDEL, then the second glitch cannot be removed from the input signal. It is desirable to have a low GDEL for a glitch removal circuit.

GRFI—GRFI is an acronym for Glitch Removal Frequency Index, which is defined as the ratio of GDEL and GRW. The performance of a glitch removal circuit is also measured in terms of GRFI. It is desirable to have a low GRFI for a glitch removal circuit.

The present invention provides a glitch removal circuit for removal of glitches in an input signal. The glitch removal circuit includes a delay circuit, a glitch blocking circuit, and a latch circuit. The delay circuit receives an input signal and introduces a delay in the input signal. The glitch blocking circuit is coupled to the delay circuit. The glitch blocking circuit receives the input signal and the delayed input signal as inputs and blocks the input signal if there is a glitch present in it. The latch circuit is coupled to the output of the glitch blocking circuit. The latch circuit inverts the output of the glitch blocking circuit and also stores the output on a continuous basis. The latch circuit provides a generally glitch free signal as an output.

In one embodiment, the present is a glitch removal circuit including a delay circuit, a glitch blocking circuit and a latch. The delay circuit receives an input signal and generates first and second delayed input signals. The glitch blocking circuit is coupled to the delay circuit and removes both positive and negative glitches from the input signal. The glitch blocking circuit includes a first PMOS transistor receiving the input signal, a first NMOS transistor receiving the input signal, a second PMOS transistor receiving the first delayed input signal, and a second NMOS transistor receiving the first delayed input signal. The latch circuit has an input coupled to an output of the glitch blocking circuit and provides a generally glitch free signal at its output.

In another embodiment, the present invention provides a method for removing both positive and negative glitches from an input signal to generate a glitch free signal, using a glitch blocking circuit having first and second PMOS transistors and first and second NMOS transistors. The glitch removing method includes the steps of:

delaying the input signal to generate a delayed input signal;

applying the input signal to the gates of the first PMOS and first NMOS transistors;

applying the delayed input signal to the gates of the second PMOS and second NMOS transistors;

if the input signal is glitch free, then inverting the output of the glitch blocking circuit and providing the inverted signal as the glitch free signal and storing the glitch free signal for later use;

if the input signal has a glitch, then switching off the glitch blocking circuit for a duration of the glitch and providing the previously stored glitch free signal as an output.

The glitch removal circuit, provided by the present invention, has many advantages. Firstly, it is simple in design and has a small number of transistor components. Secondly, it can remove both positive and negative types of glitches substantially simultaneously. Thirdly, it has a small circuit delay time, which makes the output signal compatible with other circuits. Fourthly, it has little pulse width distortion. Finally, it removes very short duration glitches and glitches that occur at short intervals of time.

Referring now to FIG. 1, a schematic diagram of a glitch removal circuit 100 according to an embodiment of the present invention is shown. The glitch removal circuit 100 includes a delay circuit 102, a glitch blocking circuit 104, and a latch circuit 106. The delay circuit 102 receives an input signal and introduces a delay in the input signal to generate a delayed input signal. The glitch blocking circuit 104 is coupled to the delay circuit 102. The glitch blocking circuit 104 receives the input signal and the delayed input signal as inputs and blocks the input signal if there is a glitch present in the input signal. The latch circuit 106 is coupled to the output of the glitch blocking circuit 104. The latch circuit 106 inverts the output of the glitch blocking circuit 104 and stores the inverted signal on a continuous basis. The latch circuit 106 provides a generally glitch free signal as the output.

The delay circuit 102 has a first inverter 108, a second inverter 110 and a third inverter 112. The input of the first inverter 108 receives the input signal. The output of first inverter 108 is connected to the input of the second inverter 110. The output of the second inverter 110 is a first delayed input signal. The input of the third inverter 112 is connected to the output of the second inverter 110. The output of third inverter 112 is a second delayed input signal.

The glitch blocking circuit 104 has a first PMOS transistor 114, a first NMOS transistor 116, a second PMOS transistor 118, and a second NMOS transistor 120. The gate of the first PMOS transistor 114 receives the input signal. The gate of the first NMOS transistor also receives the input signal. The drains of the first PMOS transistor 114 and the first NMOS transistor 116 are connected together.

The gates of the second PMOS transistor 118 and the second NMOS transistor 120 receive the first delayed input signal. The drain of the second PMOS transistor 118 is connected to the source of the first PMOS transistor 114. The drain of the second NMOS transistor 120 is connected to the source of the first NMOS transistor 116. The sources of the second PMOS transistor 118 and the second NMOS transistor 120 are connected to each other and to the third inverter 112 of the delay circuit 120 and receive the second delayed input signal. The output of the glitch blocking circuit 104 is a line connected to the drains of the first PMOS transistor 114 and the first NMOS transistor 116.

The latch circuit 106 includes a fourth inverter 122 and a fifth inverter 124. The input of the fourth inverter 122 is connected to the output of the glitch blocking circuit 104. The input of the fifth inverter 124 is connected to the output of the fourth inverter 122, and the output of the fifth inverter 124 is connected to the input of the fourth inverter 122. The output of the fourth inverter 122 is the output of the latch 106 and of the glitch removal circuit 100.

Having explained the interconnections between the various components of the glitch removal circuit 100, the operation of the glitch removal circuit 100 is now described.

The glitch removal circuit 100 is capable of removing both negative glitches from a high input signal and positive glitches from a low input signal. When the input signal is high, the first PMOS transistor 114 and the second PMOS transistor 118 are switched OFF, while the first NMOS transistor 116 and the second NMOS transistor 120 are switched ON. Consequently, the input signal travels through a path formed by the delay circuit 102, second NMOS transistor 120, first NMOS transistor 116, and latch circuit 106. Consequently, a high signal output is generated at the output of the fourth inverter 122. Further, this output signal is stored in the latch 106.

When a negative glitch occurs in a high input signal, the first NMOS transistor 116 is switched OFF and the first PMOS transistor 114 is switched ON. On the other hand, a signal delay caused by the delay circuit 102 ensures that the second NMOS transistor 120 remains ON and the second PMOS transistor 118 remains OFF. Consequently, the input signal cannot pass through the path formed by the second PMOS transistor 114 and the first PMOS transistor 118, as the second PMOS transistor 118 is OFF. Similarly, the input signal cannot pass through the path formed by the second NMOS transistor 120 and the first NMOS transistor 116, as the first NMOS transistor 116 is OFF. As a result, the glitch blocking circuit 104 blocks the input signal when a glitch is present in the signal. The output of the latch circuit 106 is then provided by the previously stored high signal. Thus, the output signal is free of a negative glitch.

When the input signal is low, the first PMOS transistor 114 and the second PMOS transistor 118 and are ON, while the first NMOS transistor 116 and the second NMOS transistor 120 are OFF. The input signal travels through the path formed by the delay circuit 102, second PMOS transistor 118, first PMOS transistor 114, and latch circuit 106. Consequently, a low signal is generated at the output of the latch circuit 106. Further, this output signal is stored in the latch circuit 106.

When a positive glitch occurs in a low input signal, the first PMOS transistor 114 is switched OFF and the first NMOS transistor 116 is switched ON. On the other hand, the signal delay caused by the delay circuit 102 ensures that the second PMOS transistor 118 remains ON and the second NMOS transistor 120 remains OFF. Consequently, the input signal cannot pass through the path formed by the delay circuit 102, second NMOS transistor 120 and first NMOS transistor 116 because the second NMOS transistor 120 is OFF. Similarly, the input signal cannot pass through the path formed by the delay circuit 102, second PMOS 114, and first PMOS transistor 118 because the first PMOS transistor 114 is OFF. As a result, the glitch blocking circuit 104 blocks the input signal when a glitch is present in the signal. The output of the latch circuit 106 is then provided by the previously stored low signal. Thus, the output signal is free of a positive glitch. Thus, the glitch removal circuit 100 removes both positive and negative types of glitches from the input signal.

Figure 2:
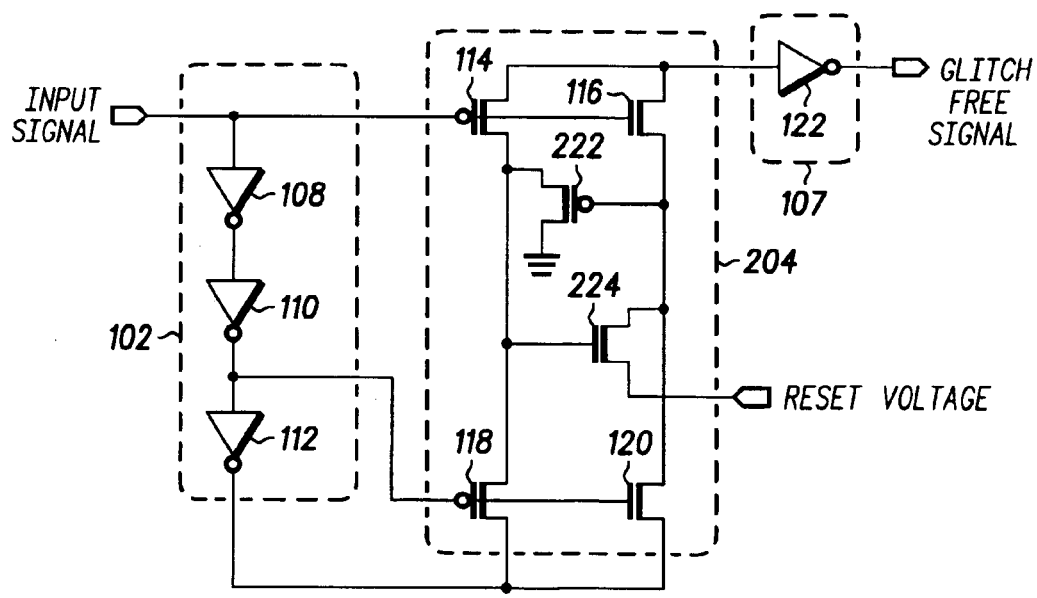
FIG. 2 is a schematic circuit diagram of a glitch removal circuit in accordance with another embodiment of the present invention.

FIG. 2 is a schematic diagram of a glitch removal circuit 200 according to another embodiment of the present invention. The glitch removal circuit 200 is similar to the glitch removal circuit 100. The only differences are that the glitch blocking circuit 104 is replaced with a glitch blocking circuit 204 and the latch circuit 106 is replaced with an inverter circuit 107.

The glitch blocking circuit 204, in addition to the components of the glitch blocking circuit 104, further includes a third PMOS transistor 222 and a third NMOS transistor 224. The gate of the third PMOS transistor 222 is connected to the source of the first NMOS transistor 116, the source of the third PMOS transistor 222 is connected to ground, and the drain of the third PMOS transistor 222 is connected to the source of the first PMOS transistor 114. The gate of the third NMOS transistor 224 is connected to the drain of the second PMOS transistor 118, the source of the third NMOS transistor 224 is connected to a reset voltage (Vdd), and the drain of the third NMOS transistor 224 is connected to the drain of the second NMOS transistor 120. The inverter circuit 107 comprises the inverter 122 connected between the drain of the first NMOS transistor 116 and an output of the glitch removal circuit 200.

The operation of the glitch blocking circuit 204 is similar to the operation of the glitch blocking circuit 104. The third PMOS transistor 222 and the third NMOS transistor 224 are provided to reset the transistors that are switched OFF to a common voltage in order to maintain a stable output condition when the respective path turns ON as the input signal transitions. Removing the fifth inverter 124 from latch circuit provides for an inverted output. The capacitance at the node between the drains of the first PMOS and first NMOS transistors 114 and 116 is high enough to hold voltage. Consequently, the output of the glitch removal circuit 200 is very stable.

It will be apparent to one skilled in the art that there can be some modifications to the glitch removal circuit 100 or the glitch removal circuit 200. The gates of the first PMOS transistor 114, first NMOS transistor 116, second PMOS-transistor 118 and second NMOS transistor 120 should receive the same logic level. Further, the drains of the second PMOS transistor 118 and second NMOS transistor 120 should be connected to the inverted logic level. On this basis, the invertors can be moved around giving numerous modifications to the glitch removal circuit 100. Various embodiments describing modifications to the glitch removal circuit 100 are explained below with reference to FIGS. 3–6.

Figure 3:
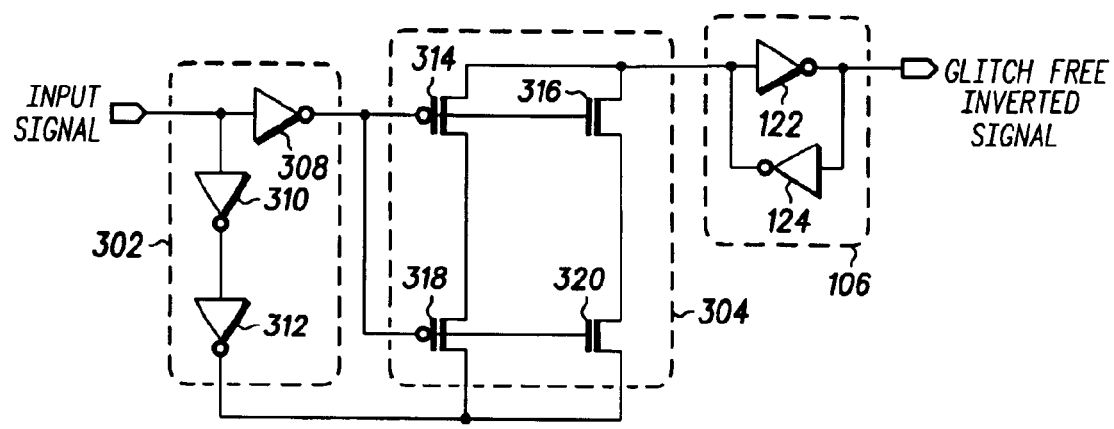
FIG. 3 is a schematic circuit diagram of a glitch removal circuit in accordance with another embodiment of the present invention.

FIG. 3 is a schematic circuit diagram of another embodiment of a glitch removal circuit 300 in accordance with the present invention. The glitch removal circuit 300 includes a delay circuit 302, a glitch blocking circuit 304, and a latch circuit 106. The delay circuit 302 receives an input signal and generates first and second delayed input signals. The glitch blocking circuit 304 is coupled to the delay circuit 302. The glitch blocking circuit 304 receives the first delayed input signal as an input and blocks the input signal if there is a glitch present in the input signal. The latch circuit 106 is coupled to the output of the glitch blocking circuit 304. The latch circuit 106 inverts the output of the glitch blocking circuit 304 and stores it on a continuous basis. The latch circuit 106 provides a generally glitch free inverted signal as the output of the glitch removal circuit 300.

The delay circuit 302 comprises a first inverter 308, a second inverter 310, and a third inverter 312. The inputs of the first and second inverters 308 and 310 receive the input signal. The output of the first inverter 308 is coupled to the glitch blocking circuit 304. The output of the second inverter 310 is connected to the input of the third inverter 312. The output of the third inverter 312 is coupled to the glitch blocking circuit 304.

The glitch blocking circuit 304 comprises a first PMOS transistor 314, a first NMOS transistor 316, a second PMOS transistor 318, and a second NMOS transistor 320. The gates of the first PMOS and first NMOS transistors 314 and 316 as well as the gates of the second PMOS and second NMOS transistors 318 and 320 receive the output of the first inverter 308. The drains of the first PMOS and first NMOS transistors 314 and 316 are connected together. The source of the first PMOS transistor 314 is connected to the drain of the second PMOS transistor 318 and the source of the first NMOS transistor 316 is connected to the drain of the second NMOS transistor 320. The sources of the second PMOS and second NMOS transistors 318 and 320 are connected to the delay circuit 302 and receive the second delayed input signal output by the third inverter 312. The output of the glitch blocking circuit 304 is derived at the drain of the first NMOS transistor 316. The latch circuit 106 is the same as for the glitch removal circuit 100 (FIG. 1).

Figure 4:
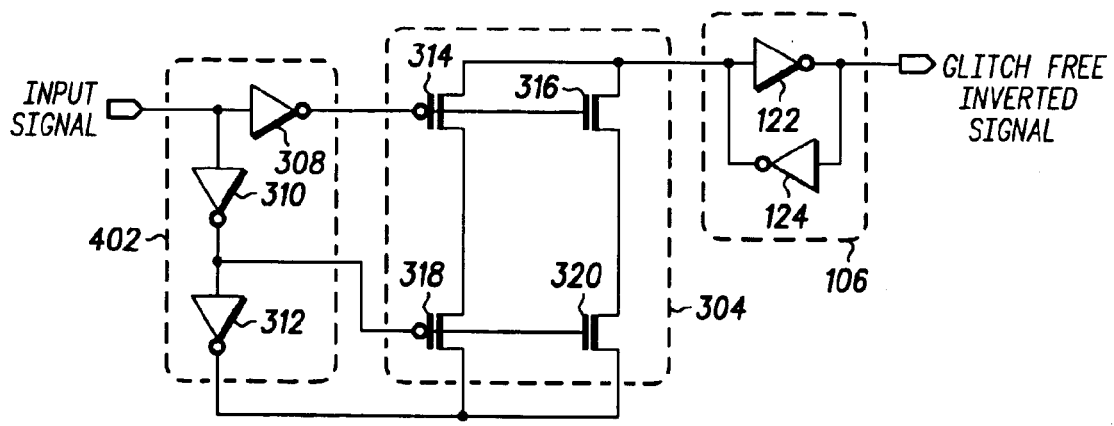
FIG. 4 is a schematic circuit diagram of a glitch removal circuit in accordance with another embodiment of the present invention.

FIG. 4 shows yet another embodiment of a glitch removal circuit in accordance with the present invention. A glitch removal circuit 400 includes a delay circuit 402, the glitch blocking circuit 304, and the latch circuit 106. The delay circuit 402 is the same as the delay circuit 302 except that the delay circuit 402 provides first, second and third delayed output signals. The first delayed output signal is generated by the first inverter 308. The second delayed output signal is generated by the second inverter 310 and the third delayed output signal is generated by the third inverter 312. The first PMOS and first NMOS transistors 314 and 316 receive the first delayed input signal at their gates, while the second PMOS and second NMOS transistors 318 and 320 receive the second delayed input signal at their gates. The sources of the second PMOS and second NMOS transistors 318 and 320 are coupled to the inverter 312 and receive the third delayed input signal.

Figure 5:
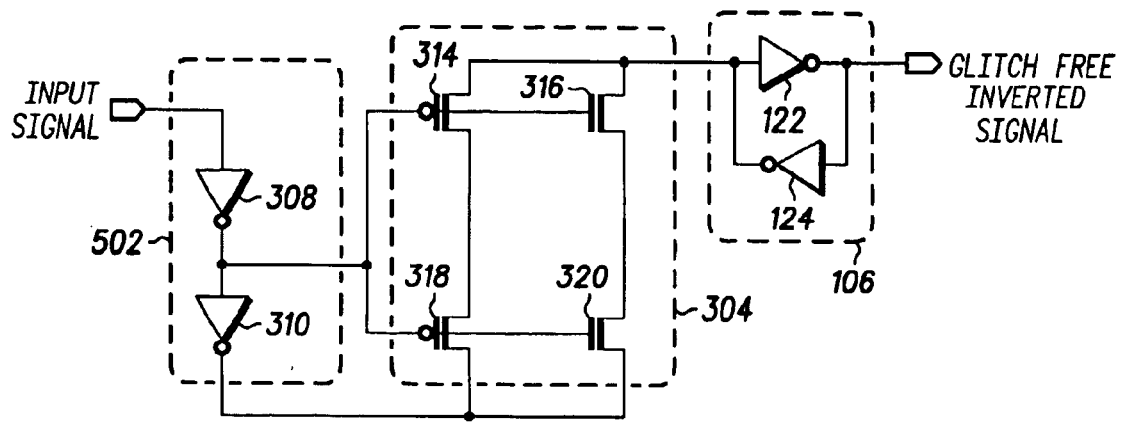
FIG. 5 is a schematic circuit diagram of a glitch removal circuit in accordance with another embodiment of the present invention.

FIG. 5 shows another embodiment of the present invention in which a glitch removal circuit 500 comprises a delay circuit 502, the glitch blocking circuit 304, and the latch circuit 106. The delay circuit 502 includes first and second inverters 308 and 310 connected in series. The input of the first inverter 308 receives the input signal. The output of the first inverter 308 is a first delayed input signal and the output of the second inverter 310 is a second delayed input signal. The first delayed input signal is provided to the gates of the first and second PMOS transistors 314 and 318 and the first and second NMOS transistor 316 and 320. The second delayed input signal is provided to the sources of the second PMOS transistor 318 and the second NMOS transistor 320.

Figure 6:
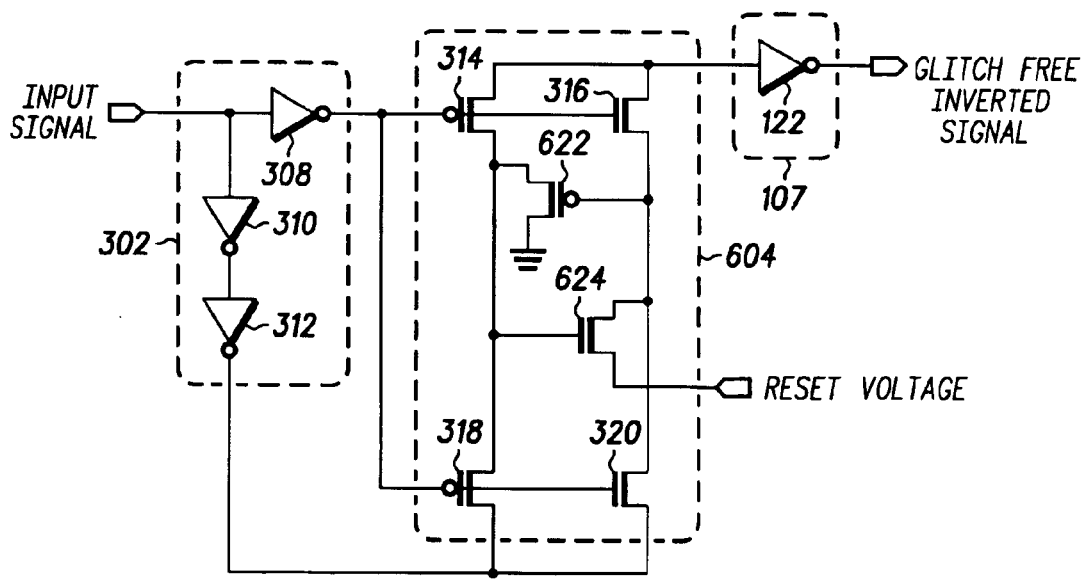
FIG. 6 is a schematic circuit diagram of a glitch removal circuit in accordance with another embodiment of the present invention.

FIG. 6 shows another embodiment of a glitch removal circuit 600 in accordance with the present invention. The glitch removal circuit 600 includes the delay circuit 302, a glitch blocking circuit 604, and the inverter circuit 107. The glitch removal circuit 600 is similar to the glitch removal circuit 200 except for the substitution of the delay circuit 302 for the delay circuit 102 and the connection of the delay circuit 302 to the glitch blocking circuit 604. More particularly, the first NMOS and first PMOS transistors 314 and 316 of the glitch blocking circuit 604 have their gates coupled to the first inverter 308 of the delay circuit 302. Similarly, the second NMOS and second PMOS transistors 318 and 320 of the glitch blocking circuit 604 have their gates coupled to the first inverter 308 of the delay circuit 302. The second delayed input signal output by the third inverter 312 is provided to the sources of the second PMOS transistor 318 and the second NMOS transistor 320. Like the glitch blocking circuit 204, the glitch blocking circuit 604 includes a third PMOS transistor 622 and a third NMOS transistor 624. The gate of the third PMOS transistor 622 is connected to the source of the first NMOS transistor 316, the source of the third PMOS transistor 622 is connected to a reset voltage (ground), and the drain of the third PMOS transistor 622 is connected to the source of the first PMOS transistor 314. The gate of the third NMOS transistor 624 is connected to the drain of the second PMOS transistor 318, the source of the third NMOS transistor 624 is connected to a voltage source (Vdd), and the drain of third NMOS transistor 624 is connected to the drain of the second NMOS transistor 320.

The operation of the glitch blocking circuit 604 is similar to the operation of the glitch blocking circuit 304. In this embodiment, the third PMOS transistor 622 and the third NMOS transistor 624 are provided to reset the transistors that are switched OFF to a common voltage. Consequently, the output of glitch blocking circuit 604 is very stable. It will be apparent to one skilled in the art that the third PMOS transistor 622 and the third NMOS transistor 624 could also be applied to the glitch removal circuits 300, 400 and 500, in a similar manner as described with reference to FIG. 6.

FIGS. 1–6 show various embodiments of a glitch removal circuit in accordance with the present invention. However, it will be understood that various modifications may be made to the circuits and thus, the invention should not be limited to the specific embodiments shown. For example, in any of the above embodiments, a transmission gate could replace any two inverters connected in series, or the output of the glitch blocking circuit in FIGS. 3–6 could be used to provide a non-inverted output. Also, in FIGS. 3–5, the latch circuit 106 could be replaced with the inverter circuit 107 as in FIG. 6 as long as the capacitance at the output of the glitch blocking circuits is high enough to hold the output for the glitch time. In this case, it is recommended that the third PMOS and NMOS transistors 622 and 624 be used.

Figure 7:
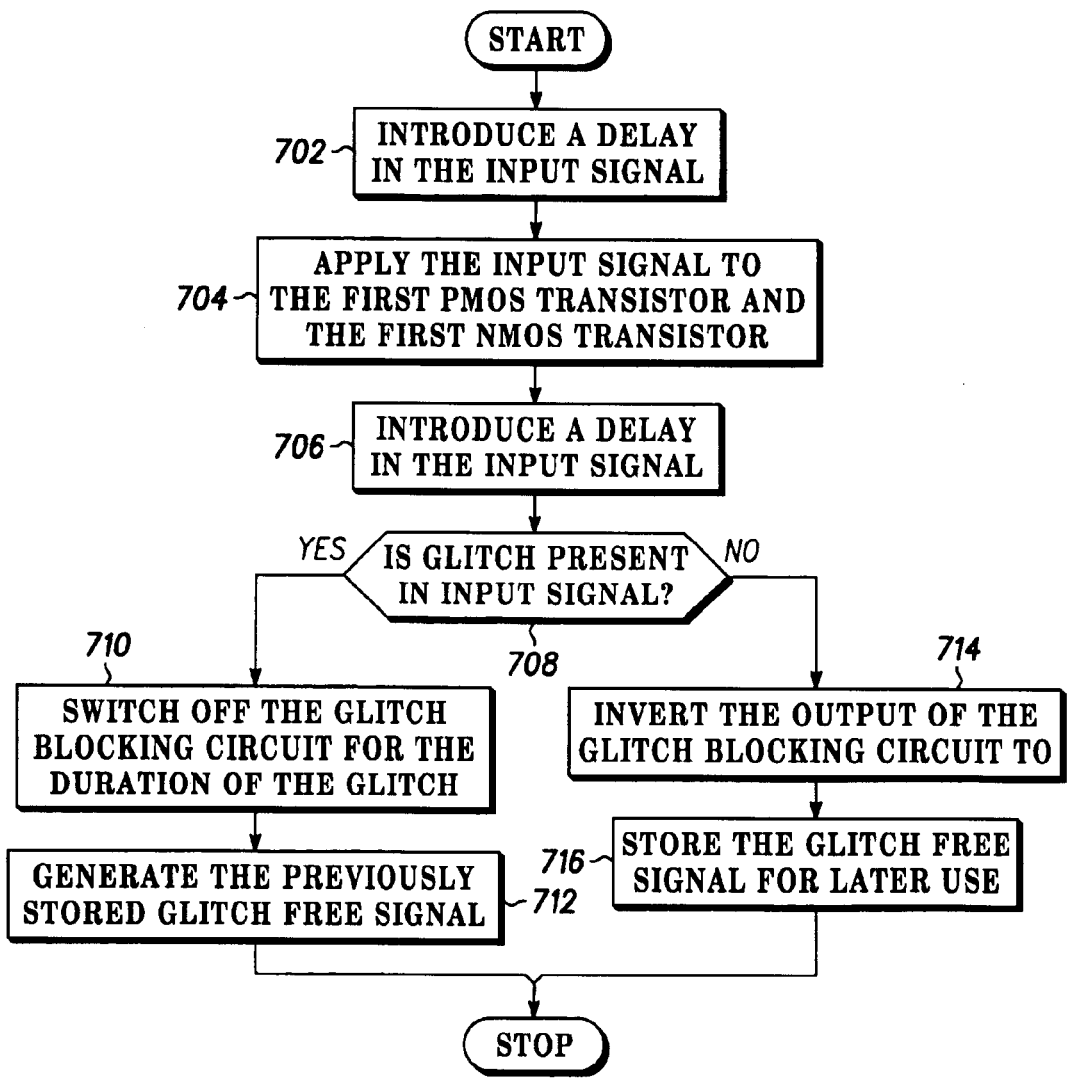
FIG. 7 is a flowchart illustrating a method of removing glitches in an input signal in accordance with the present invention.

FIG. 7 is a flowchart illustrating a method of removing glitches in an input signal using a glitch blocking circuit in accordance with the present invention. The method uses a glitch blocking circuit that has a first NMOS transistor, a first PMOS transistor, a second NMOS transistor and a second PMOS transistor. In a first step 702, a delay is introduced in the input signal. At step 704, the input signal (without delay) is applied to the first PMOS and first NMOS transistors. At step 706, the delayed input signal is applied to the second PMOS and second NMOS transistors. A check is then made at step 708 to identify the presence of a glitch in the input signal. If a glitch is present in the input signal, then steps 710 and 712 are executed. If there is no glitch present in the input signal, then steps 714 and 716 are executed.

When the input signal does not have a glitch, then the glitch blocking circuit inverts the input signal. At step 714, the inverted signal is re-inverted before sending it as the output signal. At step 716, the glitch free signal is stored on a continuous basis. If a glitch is present in the input signal, then, at step 710, the glitch blocking circuit is switched off for the duration of the glitch. During this duration, the output signal of the glitch blocking circuit is the same as the signal that was sent out just before the occurrence of the glitch. This is achieved by using the previously stored glitch free signal, at step 712.

The glitch removal circuit disclosed in the present invention has many advantages. The glitch removal circuit is simple in design and has a small number of transistor components. Consequently, the circuit area required by the glitch removal circuit is quite small. Further, the power requirement of the glitch removal circuit is quite low. The glitch removal circuit can remove both positive and negative types of glitches from a signal. Further, the glitch removal circuit is relatively fast in that it removes glitches from a signal but does not add a great delay to the signal.

The glitch removal circuit 100 was simulated based on a CMOS90 fabrication process to determine its performance. TABLE 1 indicates the relevant simulation results. The glitch removal circuit was designed to drive a load of 50 ff (femto farad) and the delay was set to remove glitches up to 700 ps in width (in TYP PVT). The glitch removal circuit 100 in the simulation contained only ten (10) transistors. Also, the glitch removal circuit 200 was simulated and the results are shown in Table 1.

TABLE 1

| Circuit | Max GRW | Total Circuit Delay (DELAY) | Performance Ratio Index GRW/DELAY | Output signal duty cycle (high period/time period) | GDEL | GRFI |
| --- | --- | --- | --- | --- | --- | --- |
| FIG. 1 | 700 ps | 950 ps | 0.74 | 51% | 680 ps | 0.97 |
| FIG. 2 | 700 ps | 810 ps | 0.86 | 51% | 880 ps | 1.25 |

The results of the simulation showed that the glitch removal circuits 100 and 200 have a high PRI, low GDEL, low GRFI, and low delay time. All of these properties are desirable in a glitch removal circuit. Also, the delay time of the two transistor paths of the glitch blocking circuit 104 (i.e. first and second PMOS transistors 114 and 118 versus first and second NMOS transistors 116 and 120) can be balanced to produce ideally zero pulse width distortion by adjusting sizes of the PMOS and NMOS transistors in the paths to a same constant ratio.

While the preferred embodiments of the invention have been illustrated and described, it will be clear that the invention is not limited to these embodiments only. Numerous modifications, changes, variations, substitutions and equivalents will be apparent to those skilled in the art without departing from the spirit and scope of the invention as described in the claims.

What is claimed is:

1. A glitch removal circuit, comprising:
    a delay circuit that receives an input signal and generates first and second delayed input signals, wherein the delay circuit includes first and second inverters connected in series, the first inverter receiving the input signal and the second inverter generating the first delayed input signal and a third inverter having an input connected to the output of the second inverter, the third inverter generating the second delayed input signal;

a glitch blocking circuit, coupled to the delay circuit, for removing both positive and negative glitches from the input signal, the glitch blocking circuit comprising:
  a first PMOS transistor receiving the input signal;
  a first NMOS transistor receiving the input signal;
  a second PMOS transistor receiving the first delayed input signal; and
  a second NMOS transistor receiving the first delayed input signal; and
a latch circuit, having an input coupled to an output of the glitch blocking circuit, for providing a generally glitch free signal.

2. The glitch removal circuit according to claim 1, wherein the delay circuit comprises at least one transmission gate.

3. The glitch removal circuit according to claim 1, wherein the glitch blocking circuit comprises:
  the first PMOS transistor having a gate receiving the input signal;
  the first NMOS transistor having a gate receiving the input signal, a drain connected to a drain of the first PMOS transistor, and wherein the output of the glitch blocking circuit is derived from the drain of the first NMOS transistor;
  the second PMOS transistor having a gate receiving the first delayed input signal, a drain connected to a source of the first PMOS transistor, and a source receiving the second delayed input signal; and
  the second NMOS transistor having a gate receiving the first delayed input signal, a drain connected to a source of the first NMOS transistor, and a source receiving the second delayed input signal.

4. The glitch removal circuit according to claim 3, wherein the latch circuit comprises:
  a fourth inverter having an input connected to the output of the glitch blocking circuit; and
  a fifth inverter having an input connected to an output of the fourth inverter, and an output connected to the input of the fourth inverter, wherein the generally glitch free signal is derived from the output of the fourth inverter.

5. The glitch removal circuit according to claim 1, wherein the glitch blocking circuit further comprises:
  a third PMOS transistor having a gate connected to the source of the first NMOS transistor, a source connected to ground, and a drain connected to the source of the first PMOS transistor; and
  a third NMOS transistor having a gate connected to the source of the first PMOS transistor, a source connected to a reset voltage, and a drain connected to the source of the first NMOS transistor.

6. The glitch removal circuit according to claim 5, wherein the latch circuit comprises an inverter having an input connected to the output of the glitch blocking circuit.

7. A glitch removal circuit for removing positive and negative glitches from an input signal, comprising:
  a delay circuit having first and second inverters connected in series, the first inverter receiving the input signal and the second inverter generating a first delayed input signal, and a third inverter having an input connected to the output of the second inverter, the third inverter generating a second delayed input signal;
  a glitch blocking circuit, coupled to the delay circuit, for removing both positive and negative glitches from the input signal, the glitch blocking circuit comprising:
    a first PMOS transistor having a gate receiving the input signal;
    a first NMOS transistor having a gate receiving the input signal, a drain connected to a drain of the first PMOS transistor, and wherein an output of the glitch blocking circuit is derived from the drain of the first NMOS transistor;
    a second PMOS transistor having a gate receiving the first delayed input signal, a drain connected to a source of the first PMOS transistor, and a source receiving the second delayed input signal; and
    a second NMOS transistor having a gate receiving the first delayed input signal, a drain connected to a source of the first NMOS transistor, and a source receiving the second delayed input signal; and
  a latch circuit including a fourth inverter having an input connected to the output of the glitch blocking circuit and a fifth inverter having an input connected to an output of the fourth inverter and an output connected to the input of the fourth inverter, wherein a generally glitch free signal is derived from the output of the fourth inverter.

8. A glitch removal circuit, comprising:
  a delay circuit that receives an input signal and generates first and second delayed input signals;
  a glitch blocking circuit, coupled to the delay circuit, for removing both positive and negative glitches from the input signal, the glitch blocking circuit comprising:
    first and second NMOS transistors coupled to the delay circuit for receiving the first delayed input signal; and
    first and second PMOS transistors coupled to the delay circuit; and
  a latch circuit, having an input coupled to an output of the glitch blocking circuit, for providing a generally glitch free signal.

9. The glitch removal circuit according to claim 8, wherein the delay circuit comprises:
  a first inverter having an input receiving the input signal and an output providing the first delayed input signal;
  second and third inverters connected in series, the second inverter receiving the input signal and the third inverter providing the second delayed output signal.

10. The glitch removal circuit according to claim 9, wherein the glitch blocking circuit comprises:
  the first PMOS transistor having a gate receiving the first delayed input signal;
  the first NMOS transistor having a gate receiving the first delayed input signal and a drain connected to a drain of the first PMOS transistor;
  the second PMOS transistor having a gate receiving the first delayed input signal, a drain connected to a source of the first PMOS transistor, and a drain connected to the delay circuit and receiving the second delayed input signal; and
  the second NMOS transistor having a gate receiving the first delayed input signal, a drain connected to a source of the first NMOS transistor, and a drain connected to the delay circuit and receiving the second delayed input signal, wherein an output of the glitch blocking circuit is derived from the drain of the first NMOS transistor.

11. The glitch removal circuit according to claim 10, wherein the latch circuit comprises:
  a fourth inverter having an input connected to the output of the glitch blocking circuit; and
  a fifth inverter having an input connected to an output of the fourth inverter, and an output connected to the input of the fourth inverter, wherein the generally glitch free signal is derived from the output of the fourth inverter.

12. The glitch removal circuit of claim 10, wherein the glitch blocking circuit further comprises:

a third PMOS transistor having a gate connected to the source of the first NMOS transistor, a source connected to ground, and a drain connected to the source of the first PMOS transistor; and a third NMOS transistor having a gate connected to the source of the first PMOS transistor, a source connected to a reset voltage, and a drain connected to the source of the first NMOS transistor.

13. The glitch removal circuit according to claim 12, wherein the latch circuit comprises an inverter having an input connected to the output of the glitch blocking circuit.

14. The glitch removal circuit according to claim 8, wherein the delay circuit comprises:

first and second inverters connected in series, the first inverter receiving the input signal and generating the first delayed output signal and the second inverter providing the second delayed output signal.

15. The glitch removal circuit according to claim 14, wherein the glitch blocking circuit comprises:

the first PMOS transistor having a gate receiving the first delayed input signal;

the first NMOS transistor having a gate receiving the first delayed input signal and a drain connected to a drain of the first PMOS transistor;

the second PMOS transistor having a gate receiving the first delayed input signal, a drain connected to a source of the first PMOS transistor, and a drain connected to the delay circuit and receiving the second delayed input signal; and the second NMOS transistor having a gate receiving the first delayed input signal, a drain connected to a source of the first NMOS transistor, and a drain connected to the delay circuit and receiving the second delayed input signal, wherein an output of the glitch blocking circuit is derived from the drain of the first NMOS transistor.

16. The glitch removal circuit according to claim 15, wherein the latch circuit comprises:

a third inverter having an input connected to the output of the glitch blocking circuit; and a fourth inverter having an input connected to an output of the third inverter, and an output connected to the input of the third inverter, wherein the generally glitch free signal is derived from the output of the third inverter.

17. The glitch removal circuit according to claim 8, wherein the delay circuit comprises:

a first inverter having an input receiving the input signal and an output providing the first delayed input signal;

second and third inverters connected in series, the second inverter receiving the input signal and providing the second delayed input signal and the third inverter providing a third delayed output signal.

18. The glitch removal circuit according to claim 17, wherein the glitch blocking circuit comprises:

the first PMOS transistor having a gate receiving the first delayed input signal;

the first NMOS transistor having a gate receiving the first delayed input signal and a drain connected to a drain of the first PMOS transistor;

the second PMOS transistor having a gate receiving the second delayed input signal, a drain connected to a source of the first PMOS transistor, and a drain connected to the delay circuit and receiving the third delayed input signal; and the second NMOS transistor having a gate receiving the second delayed input signal, a drain connected to a source of the first NMOS transistor, and a drain connected to the delay circuit and receiving the third delayed input signal, wherein an output of the glitch blocking circuit is derived from the drain of the first NMOS transistor.

19. The glitch removal circuit according to claim 18, wherein the latch circuit comprises:

a fourth inverter having an input connected to the output of the glitch blocking circuit; and a fifth inverter having an input connected to an output of the fourth inverter, and an output connected to the input of the fourth inverter, wherein the generally glitch free signal is derived from the output of the fourth inverter.

* * * * *